United States Patent [19]

Riederer et al.

[11] Patent Number: 4,717,879
[45] Date of Patent: Jan. 5, 1988

[54] PULSE SEQUENCE FOR NMR IMAGE ACQUISITION

[75] Inventors: Stephen J. Riederer; Farhad Farzaneh, both of Durham, N.C.

[73] Assignee: Duke University, Durham, N.C.

[21] Appl. No.: 859,693

[22] Filed: May 5, 1986

[51] Int. Cl.⁴ .............................................. G01R 33/20
[52] U.S. Cl. ...................................... 324/309; 324/307
[58] Field of Search .............. 324/300, 314, 307, 308, 324/309; 128/653

[56] References Cited

PUBLICATIONS

New Technique for Single-Scan T1 Measurements using Solid Echoes, Rev. Sci. Instum. 49(8) Aug. 1978, Burum et al.
Multi-Planar Image Formation using NMR Spin-Echoes, P. Mansfield, Journal of Physics C vol. 10, No. 3, p. L55–L58, 2/14/77.
Planar Spin Imaging by MNR, P. Mansfield et al., Journal of Magnetic Resonance, No. 1, Jul. 1977.

Primary Examiner—Michael J. Tokar
Assistant Examiner—Louis M. Arana
Attorney, Agent, or Firm—Oblon, Fisher, Spivak, McClelland & Maier

[57] ABSTRACT

An improved method for obtaining a multi-slice acquisition in which images from several slices are simultaneously acquired at preselected repetition times. One scan allows for the acquiring of images from multiple slices, at multiple repetition times TR and multiple echo times TE in such a manner that all available readout time is utilized when both the first repetition time TR1 and the second repetition time TR2 are both appropriate combinations of defined measurement intervals.

8 Claims, 19 Drawing Figures

MULTIPLE SPIN-ECHO
4 MEASUREMENTS

PULSE SEQUENCE FOR NMR IMAGE ACQUISITION

The U.S. Government has a paid-up license in this invention and the right in limited circumstances to require the patent owner to license others on reasonable terms as provided for by the terms of Grant No. R01CA37993 awarded by National Institutes of Health.

BACKGROUND OF THE INVENTION

1. Field of the Invention

This invention relates to a method for providing an improved sequence of pulse control for Nuclear Magnetic Resonance imaging. More particularly, the invention concerns an improved method of obtaining a multi-slice acquisition in which images from several slices are simultaneously acquired at preselected repetition times.

2. Discussion of Background

Nuclear magnetic resonance (NMR) has recently become extremely popular for the reproduction of images of the interior portions of the human body for diagnostic purposes. Although the examination of the interior body or a body portion having a variety of relatively soft tissues is the primary use for NMR techniques, they can also be utilized for circumstances whereby characteristics of tissues under inspection can be portrayed which are ordinarily not readily obtained using a radiography or other imaging techniques.

The fundamental description of basic NMR physics and imaging techniques is found in Kaufmann et al., Nuclear Magnetic Resonance Imaging in Medicine, IGAKUSHOIN Medical Publishers, Inc., New York and Tokyo (1981). The important features of the NMR technique which are commonly used in previous methods will now be elaborated upon.

The body under examination is subjected to one magnetic field which is usually constant in magnitude and another field which lies along at least one different vector from the first magnetic field. The second magnetic field is usually time-varying with the exact characteristic of each of these fields being a function of choice between any one of several available imaging techniques. During NMR examinations, the characteristics of the field energy must be pre-selected. As an example, one of the techniques called a spin-echo imaging, utilizes a pre-selected repetition time $T_R$, which is defined as the time between successive application of the same pulse sequence. Also pre-selected is the sampling delay time $\tau$ (TAU) which is often set equal to TE/2 where TE is the time at which a spin-echo is measured. The first and second fields are applied to the tissue being examined in accordance with selected times and the results are detected and stored with the levels of the storage signals being correlated with their physical positions and with these levels being represented by a matrix of numbers. The numbers of the matrix are then displayed as a matrix of points of pixels which have different light or dark levels and the composite of these pixels forms an image having various contrasting areas.

A physician utilizes the results of these contrasting areas within the image to observe and analyze a "slice" of the body of which the image was made from and, in a medical context, to thereby form a diagnosis. The degree of contrast between the various areas is a function of $T_R$ and $\tau$ values which are selected before the measurement is made. The degree of contrast is also a function of the intrinsic properties of the materials including the net magnetization $M_O$ (which is proportional to Proton density), and the relaxation times T1 and T2. While one particular set of values for $T_R$ and $\tau$ will produce an image with excellent contrast between certain sets of materials, it must be noted that this contrast will probably be insufficient between other types of materials being used. As a result of this varying contrast which depends upon the materials being used, it is necessary to make numerous sets of measurements with various values for $T_R$ and $\tau$. The images which result from these measurements use these different values of $T_R$ and $\tau$ in order to adequately examine various tissues involved.

This time consuming process in which the patient is often subjected to discomfort and sometimes repeatedly subjected to the effects of strong directional magnetic fields has been alleviated in accordance with the method and apparatus disclosed in copending application Ser. No. 727,674 filed Apr. 26, 1985, of which the present inventor is a co-inventor. Utilizing the method and the apparatus of the copending application an apparatus is disclosed which is capable of obtaining intrinsic parameters of the body materials under examination and forming synthetic images based on those intrinsic parameters in order to permit the synthesis of images formed on the basis of other selectable parameters. The technique of the copending application provides a method in which a minimal number of measurements can be made and in which the data derived from these measurements is used to form synthetic images which include tissue contrast of a type which have been produced by measurements made with selected parameters such as $T_R$ and $\tau$ value other than those which are actually used for the measurements.

The intrinsic parameters are generally found by acquiring NMR signals for several different repetition times TR and applying them as a function of time. The value of the spin lattice relaxation time T1 is a measure of the curvature of a smooth curve which would most closely match the plotted values of measured signals. Because of the statistical uncertainty in the measured signals, there is uncertainty in the computed value of T1 which can be compensated for by taking measurements several times at repetition times initially used or by taking measurements at additional repetition times.

Applicants' co-pending application Ser. No. 824,784 filed Jan. 31, 1986 provides a method and an apparatus for solving algorithms for the spin-relaxation time T1 and the spin-spin relaxation time T2 which are implemented as a sequence of passes through a digital video processor (DVP) which is reconfigured, between each pass, to perform the next desired mathematical step of the algorithm.

Although several acquisition techniques for clinical NMR images are utilized including schemes which acquire images for several echo times TE for several slices there is a problem with respect to patient motion which can occur between the time of scanning for a first repetition time TR1 and a second repetition time TR2 whereby images could be caused to no longer register. Additionally if a short time is used for TR1, the number of slices scanned is potentially limited.

Additional background information and disclosure of devices and techniques in the field to which this invention relates can be found in the following articles and U.S. patents.

F. W. Wehrli, J. R. McFall, and G. H. Glover. The dependence of nuclear magnetic resonance (NMR)

image contrast on intrinsic and operator-selectable parameters presented at the meeting of the SPIE, Medicine XII, volume 419, April 1983.

I. R. Young, et al. Contrast in NMR Imaging. Presented at the Society of Magnetic Resonance in Medicine, August 1983.

D. Ortendahl, et al. Calculated NMR images. Presented at the Society of Magnetic Resonance in Medicine, August 1983.

P. L. Davis, et al. Optimal spin-echo images for liver lesions by retrospective calculations. Presented at the Society of Magnetic Residence in Medicine, August 1983.

T. C. Farrar, et al. Pulse and Fourier Transform NMR. Academic Press, New York, 1971, pp. 22-29 (Multi-echo pulse sequence).

L. E. Crooks, et al. Clinical efficiency of nuclear magnetic resonance imaging. Radiology 146: 123-128 (1983). (Multi-planar multi-echo imaging.)

F. W. Wehril. Magnetic Resonance Tomorrow—Issues and Challenges. General Electric Company Medical Systems, Booklet No. 5917, 1984, p. 10 (Multi-TR multi-echo).

| U.S. Pat. No. | Inventor |
|---|---|
| 3,789,832 | Damadian |
| 4,045,723 | Ernst |
| 4,284,948 | Young |
| 4,292,977 | Krause et al |
| 4,297,637 | Crookes et al |
| 4,307,343 | Likes |
| 4,318,043 | Crookes et al |
| 4,354,499 | Damadian |
| 4,355,282 | Young et al |
| 4,390,840 | Ganssen et al |

SUMMARY OF THE INVENTION

Accordingly, it is an object of the present invention to provide a method for acquiring, in one scan, images from multiple slices, multiple repetition times TR and multiple echo times TE.

It is another object of the present invention to configure the results of a single scan to images from multiple slices, multiple repetition times TR and multiple echo times TE which are fully efficient so that all available readout time is utilized.

It is another object of the present invention to provide an efficient multi-slice multi-TR multi-echo sequence which is acquired during all available defined intervals wherein if both the first repetition time TR1 and the second repetition time TR2 are both odd multiples of said defined interval, a sequence is devised which is 100% efficient.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
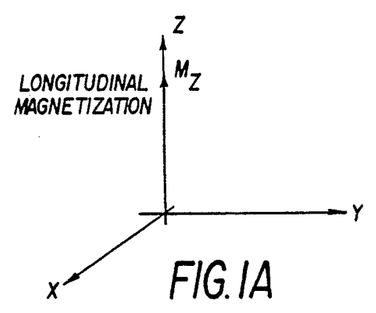
FIGS. 1A and 1B is a graphical representation of the longitudinal and transverse magnetization, respectively.
Figure 1B:
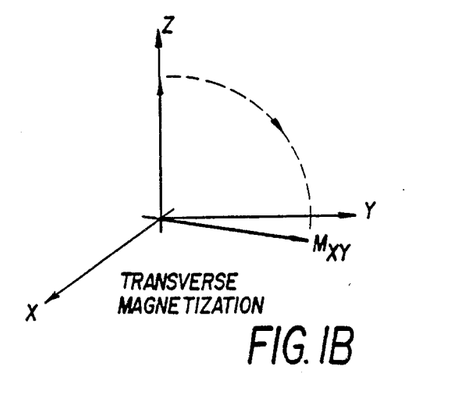

Referring now to the drawings, wherein like reference numerals designate identical or corresponding parts throughout the several views, and more particularly to FIG. 1A thereof, there is illustrated a graphical representation of the longitudinal magnetization parameter ($M_z$) which is aligned in the z axis of the xyz coordinate system. Because the quantity which is to be measured is the spin lattice relaxation time T1, which is defined as the recovery time of the longitudinal magnetization $M_z$ after it has been altered away from its equilibrium position $M_O$, this concept with respect to the longitudinal magnetization is a first step in developing a determination of T1. The FIG. 1B illustrates the "flipping" of the magnetization into a transverse plane (x-y). $M_z$, illustrated in FIG. 1, is never measured directly but is subjected to the flipping shown in FIG. 1B. The length of the "flipped" magnetization $M_{xy}$, immediately after the flip, equals that of $M_z$ prior to the flip. Because the measurement of T1 is actually the recovery time of the longitudinal magnetization after it has been altered away from an equilibrium position $M_O$, the process naturally involves the initial setting of the $M_z$ at a known quantity such as O or $-M_O$.

Figure 2A:
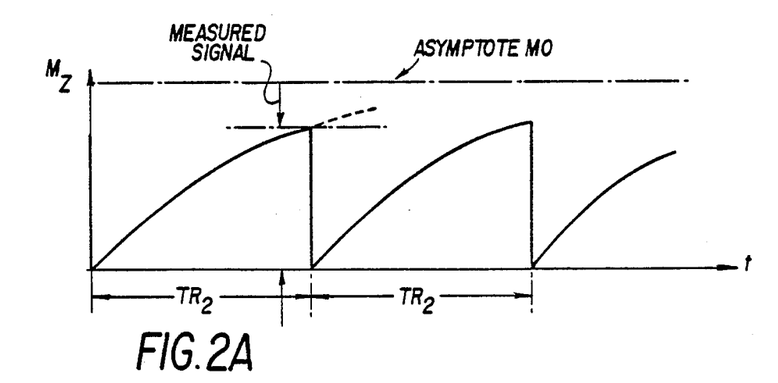
FIG. 2A and 2B is a graphical representation of the behavior of the length of the longitudinal magnetization as a function of time at different repetition times $T_R$.
Figure 2B:
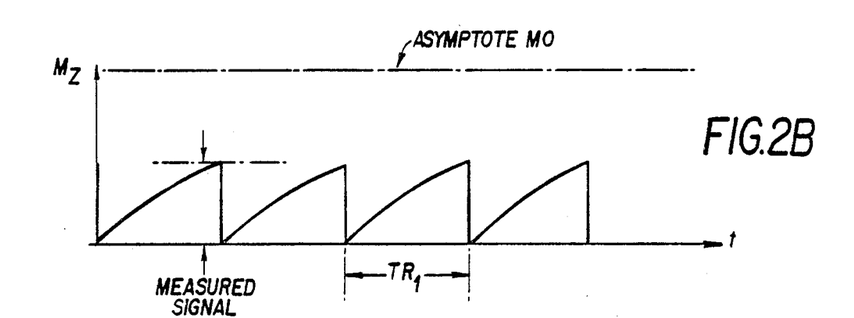

The FIG. 2A illustrates that the magnetization $M_z$ is initially set at a 0 value and then begins to change as a function of time toward asymptote $M_O$. After some selected repetition time TR2 the signal is measured and the magnetization is returned to the starting initial value or 0 in the instance of FIG. 2A. The FIG. 2B illustrates a value of $TR_1$ which is less than $TR_2$ for purposes of providing a measured signal. It can be seen that the time period $TR_1$ is less than $TR_2$ so that the measured signal is less for a shorter time period or in other words the magnetization has not had as much opportunity to approach the asymptotic value as in the instance of FIG. 2A which has a longer value for TR.

Figures 3, 4A:
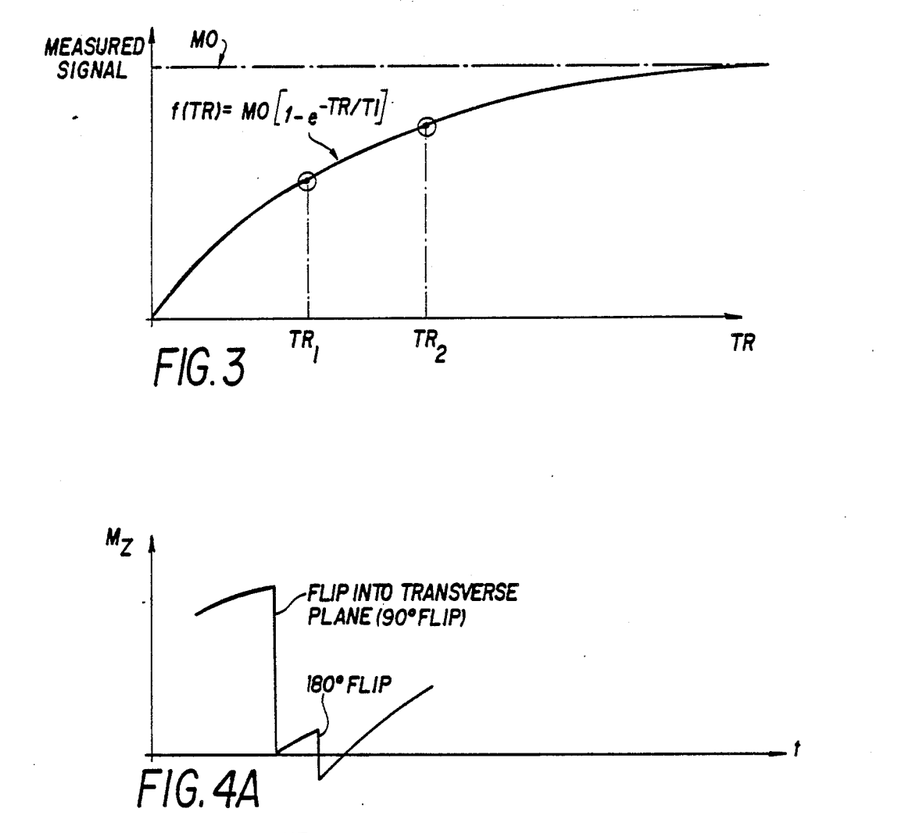
FIG. 3 illustrates a plotting of the measurements made from FIGS. 2A and 2B with respect to estimating T1 utilizing a characteristic equation.
FIGS. 4A and 4B detail the measurement process for a conventional single spin-echo.
Figure 7:
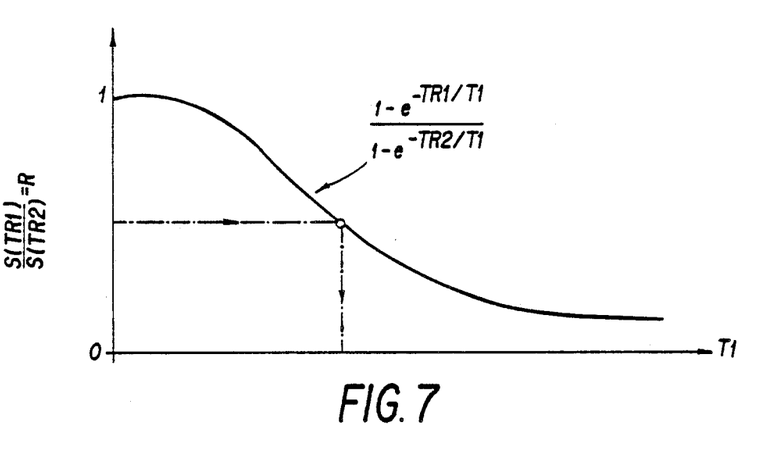
FIG. 7 is a graph of the ratio of two different TR measurement characteristic equations.

The FIG. 3 illustrates how the measurements made from FIGS. 2A and 2B are plotted and that these values fit along a curve defined by the equation such that the measured signal is a function of the asymptote and TR as well as T1. More specifically, $S(TR) = M_o[1-\exp(-TR/T1)]$ from the measured signals as reflected by FIG. 3 and the known values which are utilized for $TR_1$ and $TR_2$ a first estimate can be made with respect to T1. The actual determination from the measurements of two different TR times is shown in FIG. 7 wherein the equation $S(TR)$ for each of two different values TR1 and TR2 are divided in order to form a ratio R wherein $R = S(TR1)/S(TR2) = M_o[1-\exp(-TR1/T1)]/M_o[1-\exp(-TR2/T1)]$ wherein R is the ratio of the two measurements for TR1 and TR2. The ratio of the expressions on the right side of the equation are a function of TR1 and TR2 (known quantities) and T1 (the desired unknown). FIG. 7 shows a plot of this ratio and from the knowledge of the value of R, i.e., from a knowledge of the values of the measured signals, the FIG. 7 yields a value for T1, as shown.

Figure 4B:
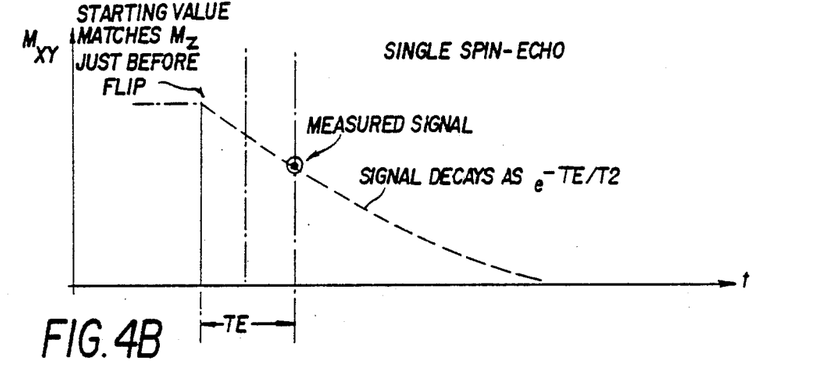

A single spin-echo treatment is shown in FIG. 4A which involves a flipping of the longitudinal magnetization into the transverse plane in a manner similar to the showings of FIGS. 1A and 1B. This is a 90° flip and the starting value, as shown in FIG. 4B, in the x-y plane for the magnetization $M_{xy}$ is equal to the longitudinal magnetization $M_z$ just prior to the flip. At a time period TE/2 a 180° flip occurs which basically involves going from a plus value to an equivalent negative value, ergo 180°. When the signal after the 180° flip recovers to the zero point or in other words after a value of TE from the initial 90° flip, a measured signal is obtained as shown in FIG. 4B. The decay of the signal value from the starting value through the measured value at time TE is controlled by the exponential function $\exp(-TE/T2)$.

Figure 5A:
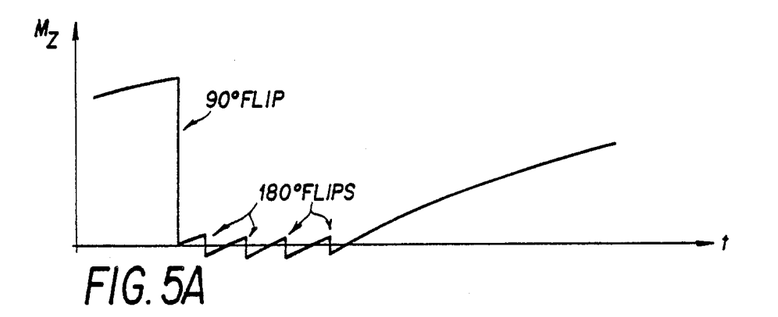
FIGS. 5A and 5B show the instance of a multiple spin-echo analogous to the FIG. 4 measurement.
Figure 5B:
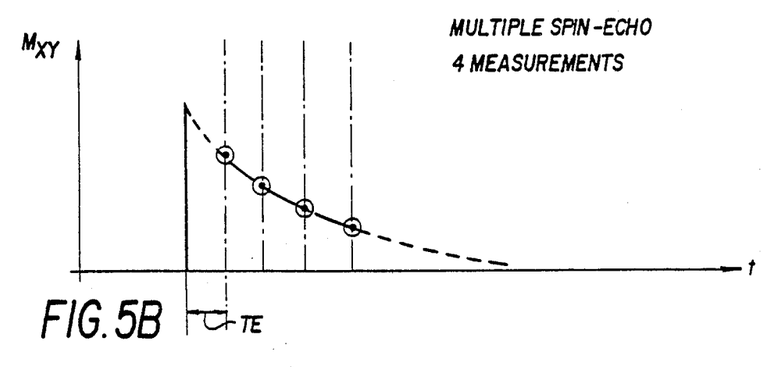

In FIGS. 5A and 5B there is shown a graphic illustration of the application of the multiple spin-echo technique which utilizes for a single scanning time the various measured signals (4 in the instance of FIG. 5) which are used to provide the various estimates for T1 at each of the four TE times of the multiple spin-echo technique. This provides for an increased number of measurements of T1 without an increased number of scans. Thus, the multiple spin-echo technique allows for the equivalent of several semi-independent measurements at each TR. With this increased number of measurements the accuracy precision which will be discussed below is improved and superior estimates of T1 can be had with no additional scanning time.

Figure 6:
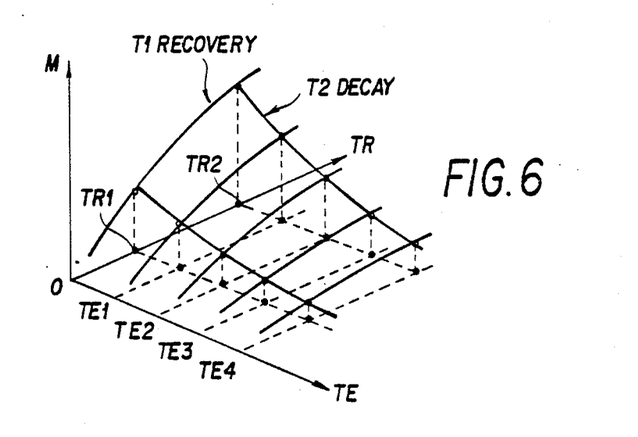
FIG. 6 is a three-dimensional plot of the magnetization of an arbitrary material which is measured in a spin-echo treatment as a function of the repetition time $T_R$ and the echo times TE.

The FIG. 6 illustrates a three-dimensional graph which shows the relationship between the longitudinal magnetization M, the repetition times TR and the spin-echo times TE. Essentially, FIG. 6 can be seen as an imposition of FIG. 3 onto FIG. 5B. It is important to note that T2 is not essential with respect to the calculation of T1 because as seen from FIG. 7, for a single estimate of T1, the T2 is not a necessary function and is not a required quantity for the determination of T1.

Although the acquisition techniques for clinical NMR images are by no means standardized, either with respect to the kind of imaging used or with respect to the kinds of scanning squences, it is a common protocol to acquire images at "long" and "short" repetition times TR1 and TR2, such as 2,000 and 500 milliseconds, with multiple echos at one or both repetition times. In routine scanning a multi-slice acquisition is often used in which images from several slices are acquired simultaneously for a given TR (this is known as multi-slice or multi-planar). This can also be extended to acquiring images for several echo times TE for several slices which is referred to a multi-echo multi-planar (or MEMP). In this particular instance the sequence is accomplished once at a "long" repetition time and is repeated at the "short" repetition time. Improved efficiency can be accomplished through the use of a multi-TR multi-echo multi-planar pulse sequence.

It is to be noted that the existing deficiencies with respect to using a long TR MEMP and a short TR MEMP is that patient motion may occur between the time of the long TR MEMP and the short TR MEMP scan to thus cause images to not be registered. Additionally with the short TR MEMP scans the number of slices is potentially limited to, 5, for example.

The present invention proposes a method whereby the long and short TR data acquisition is interleaved to thereby reduce motion misregistration and potentially increase the number of slices imaged for the short TR.

As has been indicated it is desirable to acquire in one scan, images from multiple slices, multiple repetition times TR, and multiple echo times TE. Multi-slice or multi-planar (MP) acquisitions are possible and are used in the prior art. Multiple spin-echo (MSE) or multi-echo (ME) are also used routinely as well as multi-TR or equivalently, multiple saturation recovery (MSR). Additionally, multiple spin-echo and multiple saturation recovery have been combined in the prior art into a MSR-MSE sequence in which images from a single slice are collected for multiple TRs and multiple TEs. Furthermore, as will be seen from the following analysis, the first two have also been combined in order to yield a MEMP sequence with multiple echos from multiple slices for one TR. However, the present invention is a combination of MSR-ME-MP into one sequence.

Figure 8:
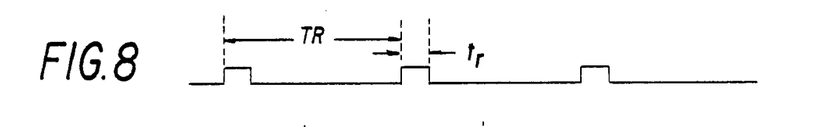
FIG. 8 is a plot of the active time (90° pulse-180° pulse-readout time) of a standard multi-echo sequence for a single TR and a single slice.

FIG. 8 shows a standard multi-echo sequence for a single TR and a single slice. The signal which is plotted versus time indicates that data is being collected for that particular slice when the signal is high. That is, during the duration k of the high state a 90° saturating pulse is applied as well as a 180° measurement pulse and the signal is then measured as indicated by the previous discussion with respect to the showing of the FIGS. 4A and 4B.

Additional 180° pulses and measurements are made depending upon the number of echos which are read out. During the interval k no data acquisition can be accomplished for other slices unless a decoding method is retrospectively applied. The scans for other slices or for other repetition times are obtained by rerunning the sequence in FIG. 8 with altered RF waveform characteristics or a different TR time, respectively.

Figure 9:
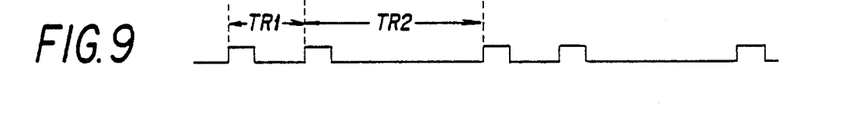
FIG. 9 shows a single slice multi-TR multi-echo sequence.

The FIG. 9 illustrates a single-slice multi-TR multi-echo sequence. Although similar to FIG. 8, the showing of FIG. 9 indicates that the time between data acquisitions alternates between TR1 and TR2. That is, the data acquisitions for the short TR (TR1) and the long TR (TR2) images are interleaved. The total scan time required to obtain images at TR1 and TR2 is the same as for the showing of FIG. 8, however, due to the interleaving, any misregistration between the TR1 and TR2 is muted.

Figure 10:
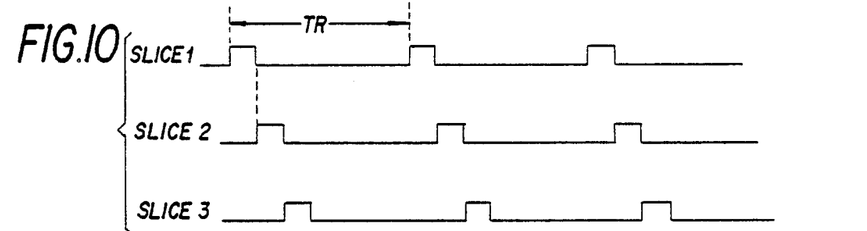
FIG. 10 shows a multi-slice, single TR multi-echo sequence.

The FIG. 10 shows a multi-slice single-TR multi-echo sequence. The sequence for slice number 1 is identical to that of FIG. 8 whereas the sequence for slice number 2 is identical to that for slice number 1 except that it is delayed by a time k so that the rising edge of the data acquisition period is simultaneous with the trailing edge for slice number 1. In practice, the alternate slices are selected by modulating the RF transmitted pulses.

It should be emphasized that in the FIGS. 8-10 and in the following figures which will be discussed below, the signals for the slices are shown individually for purposes of clarity, although in reality, all of the signals shown are directed along the same channel. That is, the 90° and the 180° pulses for slice number 1 as well as those for slice number 2 and 3 are all directed along one transmitter channel. Likewise the detected singals from slices 1, 2, 3 etc., are all received from one channel. Thus it can be easily understood that two or more slices cannot overlap. From an analysis of the FIG. 10 it is obvious that the maximum number of slices $N_{sl}$ which can be obtained is equal to TR/k. That is, if TR is, for example, equal to 700 milliseconds and if k is 100 milliseconds, then $N_{sl}$ is 7.

Figure 11:
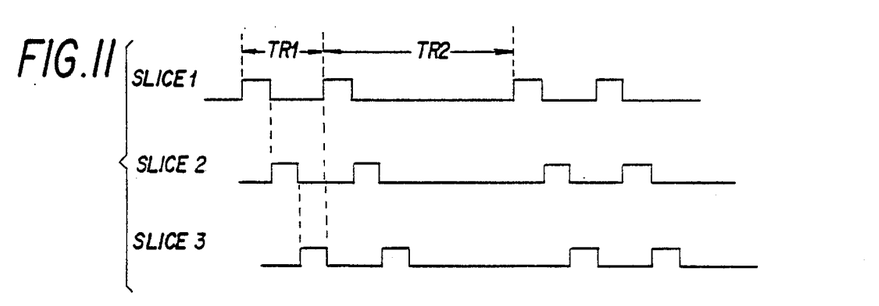
FIG. 11 shows a multi-slice, multi-TR, multi-echo pulse sequence.
Figure 12:
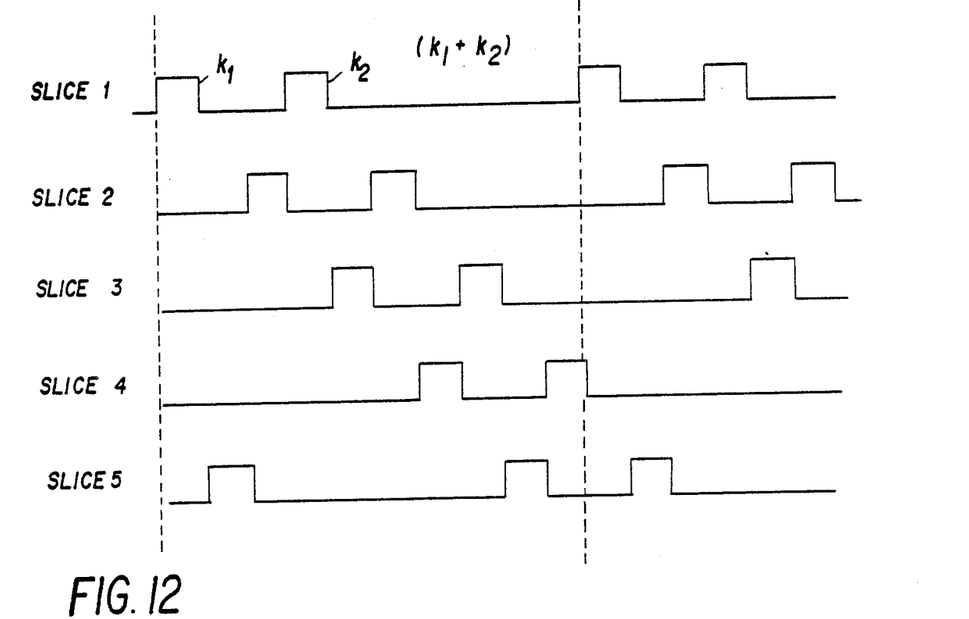
FIG. 12 shows a data rearranged efficient multi-slice, multi-TR, multi-echo sequence of the present invention which illustrates 100% efficient use of data intervals.

The important features of the finally developed invention are illustrated in the FIGS. 11 and 12 which show a multi-slice multi-TR multi-echo pulse sequence. The FIG. 11 illustrates a sequence which is accomplished by first drawing the sequence for slice number 1 which is the same as that shown in FIG. 9 and then beginning the sequence for slice number 2 delayed by an interval k. Such a delay is similar to the delay of the single-TR multi-slice case of FIG. 10. The sequence for slice number 3 in FIG. 11 follows an additional k period later. At that time the second pulse for slice number 1 is then applied. Having the three slices as shown in FIG. 11 may appear to indicate that only three slices are possible with this approach for the given value of k, TR1 and TR2 used in this example. However, an analysis of the FIG. 11 indicates that only 6 of the available 10 periods k have been used and thus the sequence shown in FIG. 11 does not make full use of the available time.

In the preferred embodiment of FIG. 12 an efficient multi-slice multi-TR multi-echo sequence is shown which provides that data can be acquired for all of the five slices shown at two different TR times desired (TR1=3k, TR2=7k). Furthermore, data is acquired during all available k intervals; i.e., the sequence is thus considered to be 100% efficient. It is easily shown that for a total TR interval of TR1+TR2 and for two measurements per slice each requiring an interval k, that the maximum number of slices which can be imaged is (TR1+TR2)/(2k).

Figure 13:
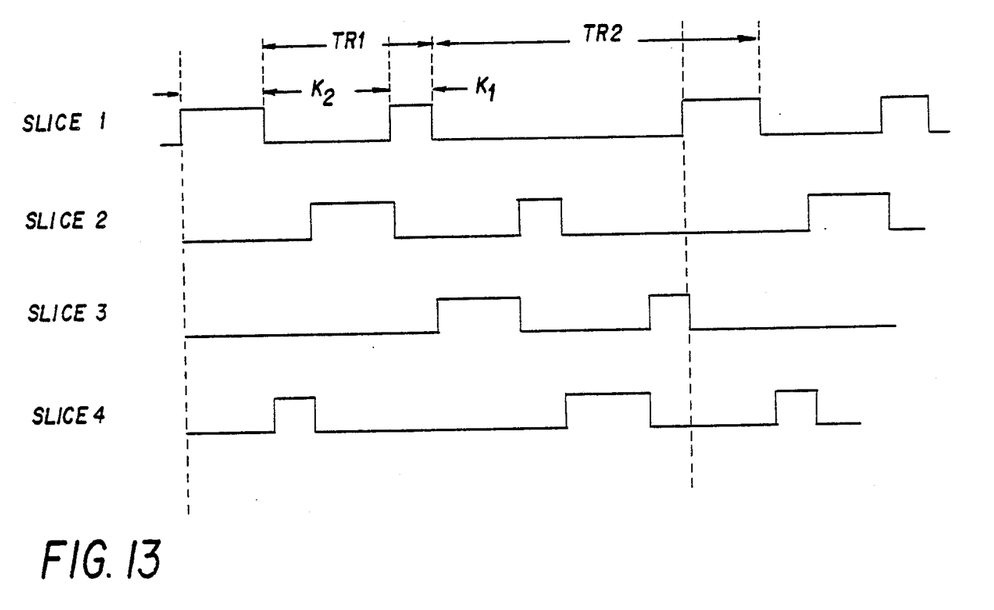
FIG. 13 shows a multi-slice multi-TR multi-echo sequence of the present invention which illustrates 100% efficient use of data intervals and which allows unequal active times for the long and short TR acqusitions.

As shown in FIG. 13, the method can be further generalized to the case in which the time interval required for readout is different for the two TR times used. That is, an interval $k_1$ is used in conjunction with TR1 and $k_2$ (not equal to $k_1$) is used with TR2. Recall that k is the time required for the 90° saturating pulse, the 180° refocusing pulse, and the readout period of the spin-echo signal. Additionally, the 180° pulse and readout portion of the interval can be repeated for as many times as there are echoes in a multiple spin-echo sequence. One situation in which different k periods would be used is the acquisition of one number of spin-echoes at TR1 and a different number at TR2. As an example suppose the duration of the k interval is 25 msec longer than the time of the last spin-echo acquired in a spin-echo sequence. If for TR1 a single echol were acquired at 25 msec, and $k_1$ would be 50 msec. If for TR2 spin-echoes were acquired at 25, 50, and 75 msec, then $k_2$ would be 100 msec. FIG. 13 shows an acquisition in which $k_2=2k_1$, TR1=$4k_1$ and TR2=$8k_1$. As seen from the figure, the sequence is 100% efficient; at all times the signal is high for at least one of the slices. The maximum number of slices which can be imaged in this case is (TR1+TR2)/($k_1+k_2$), or 4 in the example of FIG. 13.

The following description indicates how the data intervals can be assigned most efficiently. 100% efficiency means that at all times a 90°-180°-readout interval is being applied to some slice. The objective of the arranging of the data intervals is to acquire data for as many slices as possible within the time available. If the two TR times used are TR1 and TR2, then the total repetition time is TR1+TR2. If for one slice during one total repetition, data is read out from the TR1 sequence in an interval of duration $k_1$, and from the TR2 sequence in an interval $k_2$ then the total interval duration for that slice is $k_1+k_2$. Then, the maximum number of slices $N_{sl}$ which can be read out is the total repetition time divided by the total interval time per slice; i.e., $N_{sl}=(TR1+TR2)/(k_1+k_2)$. For the specific case in which both $k_1$ and $k_2$ are equal to k, then $N_{sl}=(TR1+TR2)/2k$. Having thus determined the maximum number of slices that can be imaged, we then derive what conditions must apply to TR1, TR2, $k_1$, and $k_2$ such that this maximum can be obtained in practice.

Figure 14:
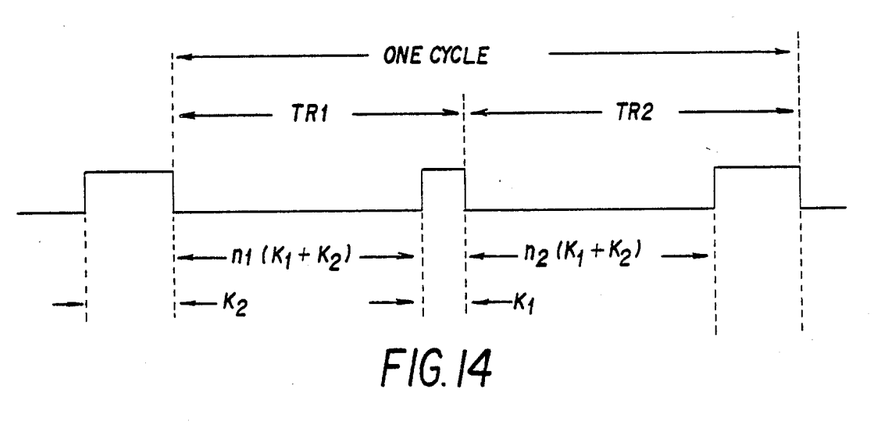
FIG. 14 illustrates a complete cycle of a data interval signal using the technique of the present invention for an arbitrary slice.

FIG. 14 is a plot versus time of one complete cycle of the data interval signal for an arbitrary slice using the proposed technique. At the end of the plot the cycle would repeat itself. The times TR1 and TR2 are defined as shown. $k_1$ is the interval duration at the end of the TR1 recovery time and $k_2$ is the interval at the end of the TR2 time as shown. One condition that must substantially hold for the sequence to be efficient is that the total repetition time TR1+TR2 be equal to some multiple of the total readout interval $k_1+k_2$; i.e., $$TR1 + TR2 = n(k_1 + k_2) \quad (1)$$

for some integer n. Additionally, within the TR1 interval not used for the readout of the slice under study in FIG. 14, one would like to allow readouts of an integral number of other slices. That is, the period preceding the $k_1$ pulse should be an integral number of ($k_1+k_2$) intervals. Mathematically this is expressed as:

$$TR1 - k_1 = n_1(k_1 + k_2) \quad (2)$$

where $n_1$ is an integer. A similar condition should apply to the TR2 interval:

$$TR2 = k_2 = n_2(k_1 + k_2) \quad (3)$$

where $n_2$ is an integer. These equations can be rearranged to give:

$$TR1 = (n_1+1)k_1 + n_1 k_2 \quad (4)$$

$$TR2 = n_2 k_1 + (n_2+1)k_2 \quad (5)$$

Upon adding these two results we see that Eq. 1 is satisfied with $n=n_1+n_2+1$. Additionally, for the special case in which $k_1$ and $k_2$ both equal k we get:

$$TR1=(2n_1+1)k \quad (6)$$

$$TR2=(2n_2+1)k \quad (7)$$

That is, TR1 and TR2 are both odd multiples of k.

Having described the mathematical conditions, we next describe how the data intervals can be arranged for maximum efficiency. Suppose $k_1$ and $k_2$ are the data intervals for TR1 and TR2 and h is the greatest common divisor of $k_1$ and $k_2$. That is, h is the largest number that can get divided into $k_1$ and $k_2$ an integral number of times. For example, if $k_1$ is 40 msec and $k_2$ is 60 msec, then h is 20 msec. Let $m_1$ equal $k_1/h$ and $m_2$ be $k_2/h$; in this example $m_1$ is 2 and $m_2$ is 3. Next suppose that TR1 and TR2 satisfy Eqs. 4 and 5. For example TR1=140 msec and TR2=260 msec. The assignment of intervals begins by first considering a plot of length TR1+TR2 separated into intervals of length h as shown in FIG. 15A. Next categorize intervals of length $k_2$ and $k_1$ in alternating fashion. What this means in FIG. 15B is that the first $m_2$ intervals of length h become the first $k_2$ interval. The next $m_2$ h intervals become a $k_1$ interval, etc., the $k_1$ and $k_2$ assignment being an alternating process. By way of the above example $k_2$ is 3 h intervals wide and $k_1$ 2 h intervals wide.

Figure 15:
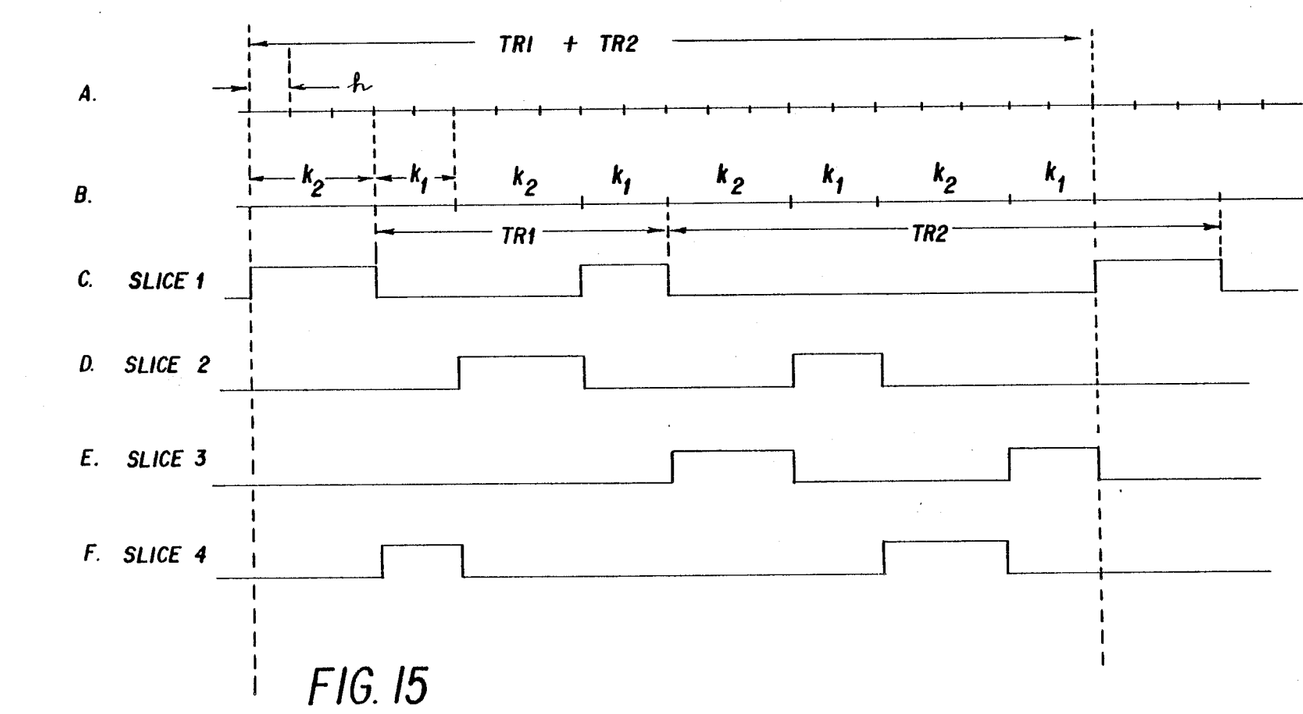
FIG. 15 illustrates the assignment of intervals in order to obtain the maximum efficiency of the present invention.

Next the assignment of intervals for the first slice begins. It is desired to assign a $k_1$ and $k_2$ interval to it such that the TR times between these intervals are TR1 and TR2. As shown in FIG. 15C the first $k_2$ interval available is assigned to this slice. At a time $TR1-k_1$ after the end of the $k_2$ interval the $k_1$ interval for this slice begins. As seen, the time from the end of the assigned $k_2$ interval to the end of the $k_1$ interval is equal to TR1 as desired. Since the process will repeat cyclically as shown to the right of the dashed vertical line in FIG. 15, it is clear that from the end of the assigned $k_1$ interval to the end of the assigned $k_2$ interval is time TR2, again as desired.

Having assigned the $k_1$ and $k_2$ slots for Slice 1, one proceeds to Slice 2. The next available $k_2$ and $k_1$ slots following those used for Slice 1 are assigned to $k_2$ as shown in FIG. 15D. Because the start of each interval is displaced in time by the same amount ($k_1+k_2$) from the start of the corresponding interval for Slice 1, the time differences between intervals are preserved. That is, the same TR1 and TR2 are obtained as for Slice 1.

The assignment continues for all slices in the same manner. One simply assigns to each new slice the next available $k_2$ interval until all such $k_2$ intervals within the total TR1+TR2 time have been assigned. One does the same with the $k_1$ intervals as well. However, when a slice first occurs such that the $k_1$ interval to be assigned falls beyond the total TR1+TR2 time interval, then the very first $k_1$ interval at the beginning of the sequence is assigned to that slice. In FIG. 15 this occurs for Slice 4. For any subsequent slices the $k_1$ interval assigned is that one immediately following.

Thus, it has been shown that a $k_1$ and $k_2$ interval can be assigned to each slice, the times between these intervals are the desired TR1 and TR2, and that all $k_1$ and $k_2$ intervals are assigned. This last statement is equivalent to saying that this assignment of intervals is 100% efficient. At all times in the total TR1+TR2 interval, a $k_1$ or $k_2$ interval is assigned to some slice.

Thus, with the method of the present invention, a long and short TR data acquisition is interleaved, which subsequently reduces a motion misregistration and potentially increases the number of slices which can be imaged for the short TR. Although one method of interleaving the MEMP acquisition for two values of TR has been shown, there are other methods and algorithms which could be used, as long as the essential concept of providing readouts at all possible times is maintained.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An improved method of Nuclear Magnetic Resonance (NMR) scanning by which images from multiple slices, multiple repetition times TR and multiple echo times TE are obtained in a single scan of a body, comprising the steps of:
   subjecting said body to magnetic fields in accordance with a NMR technique using a multiple spin-echo multi-slice pulse sequence at a plurality (n) of different predetermined stored pulse repetition times TR(n);
   measuring a plurality of sets of signals wherein each of said sets corresponds to one of said multiple slices and wherein each one signal of each of said sets corresponds to each of said plurality of predetermined stored pulse repetition times TR(n) wherein each signal of each of said sets begins at a corresponding one of said plurality of pulse repetition times and wherein the length of each of said measuring of each one of said signals of said set of signals is a predetermined time interval k.

2. The method according to claim 1 wherein said plurality of predetermined stored pulse repetition times is equal to two.

3. An improved method of Nuclear Magnetic Resonance (NMR) scanning by which images from multiple slices, multiple repetition times TR and multiple echo times TE are obtained in a single scan of a body, comprising the steps of:
   subjecting said body to magnetic fields in accordance with a NMR technique using a multiple spin-echo multi-slice pulse sequence at a plurality of different predetermined stored pulse repetition times TR(n);
   measuring a plurality of sets of signals each signal of each of said sets corresponding to each of said plurality of predetermined stored pulse repetition times for one of said plurality of slices and wherein each measurement of each signal of each of said sets begins at a corresponding one of said predetermined stored pulse repetition times and wherein the beginning of each set of said sets is at a different time and wherein the total length of measurement of each set (m) is constant and wherein the length of time of measurement of each signal of each of said sets is defined as the time required to selectively flip the magnetization into the transverse plane and read the value of the flipped magnetization and wherein the maximum number of slices of said multiple slices is equal to $\Sigma TR(n)/(m)$.

4. the method according to claim 3 wherein said plurality of predetermined stored pulse repetition times equals two.

5. An improved method of Nuclear Magnetic Resonance (NMR) scanning by which images from multiple slices, multiple repetition times TR and multiple echo times TE are obtained in a single scan of a body, comprising the steps of:
  subjecting said body to magnetic fields in accordance with a NMR technique using a multiple spin-echo multi-slice pulse sequence at a plurality of different predetermined stored pulse repetition times TR(n);
  measuring a plurality of sets of signals each signal of each of said sets corresponding to each of said plurality of predetermined stored pulse repetition times for one of said plurality of slices and wherein each measurement of each signal of each of said sets begins at a corresponding one of said predetermined stored pulse repetition times and wherein the beginning of each set of said sets is at a different time and wherein the total length of measurement of each set (m) is constant and wherein the length of time of measurement of each signal of each of said sets is defined as the time required to perform a selective 90°-selective 180°-readout sequence wherein the selective 180° and the readout sequence can be repeated within a particular interval for a number of times equal to the number of spin-echoes for each one of said plurality of different predetermined stored pulse repetition times and wherein the maximum number of slices of said multiple slices is equal to $\Sigma TR(n)/(m)$.

6. The method according to claim 5 wherein the number of spin-echoes is the same for each of said plurality of predetermined pulse repetition times.

7. The method according to claim 5 wherein the number of spin-echoes for one of said predetermined pulse repetition times is not equal to the number of spin-echoes for other ones of said predetermined time intervals.

8. The method according to claim 5 wherein there are two predetermined stored pulse repetition times.

* * * * *